United States Patent [19]
Cobbs

[11] Patent Number: 5,325,515
[45] Date of Patent: Jun. 28, 1994

[54] SINGLE-COMPONENT MEMORY CONTROLLER UTILIZING ASYNCHRONOUS STATE MACHINES

[75] Inventor: David H. Cobbs, Marlborough, Mass.

[73] Assignee: NEC Electronics, Inc., Mountain View, Calif.

[21] Appl. No.: 699,823

[22] Filed: May 14, 1991

[51] Int. Cl.[5] .............................................. G06F 1/04
[52] U.S. Cl. ................................... 395/550; 395/275; 364/238.4
[58] Field of Search ........................ 395/550, 275, 425; 364/238.4, 926.92, 259.1, 270.6; 307/269, 272.1

[56] References Cited

U.S. PATENT DOCUMENTS

| | | | |
|---|---|---|---|
| 4,754,425 | 6/1988 | Bhadriraju | 364/900 |
| 4,827,157 | 5/1989 | Machida et al. | 307/262 |
| 4,870,562 | 9/1989 | Kimoto et al. | 395/550 |
| 4,918,657 | 4/1990 | Takahaski | 365/203 |
| 5,014,188 | 5/1991 | Kawamura | 364/200 |

OTHER PUBLICATIONS

Handbook For Electronics Engineering Technicians/Second Edition/Milton Kaufman/1984/pp. 15-9 to 15-10.

*Primary Examiner*—Dale M. Shaw
*Assistant Examiner*—Moustafa M. Meky
*Attorney, Agent, or Firm*—Skjerven, Morrill, MacPherson, Franklin & Friel

[57] ABSTRACT

An asynchronous memory controller comprises plurality of flip-flops connected in a series. The input of the first flip-flop receives a signal indicating the start of a bus cycle. The input of each succeeding flip-flop in the series is connected to the output of the preceding flip-flop. The odd-numbered flip-flops in the series are activated by a first state of a clock pulse; the even-numbered flip-flops in the series are activated by a second state of a clock pulse. Each flip-flop responds to a level of the clock pulse rather than a rising or falling edge.

16 Claims, 6 Drawing Sheets

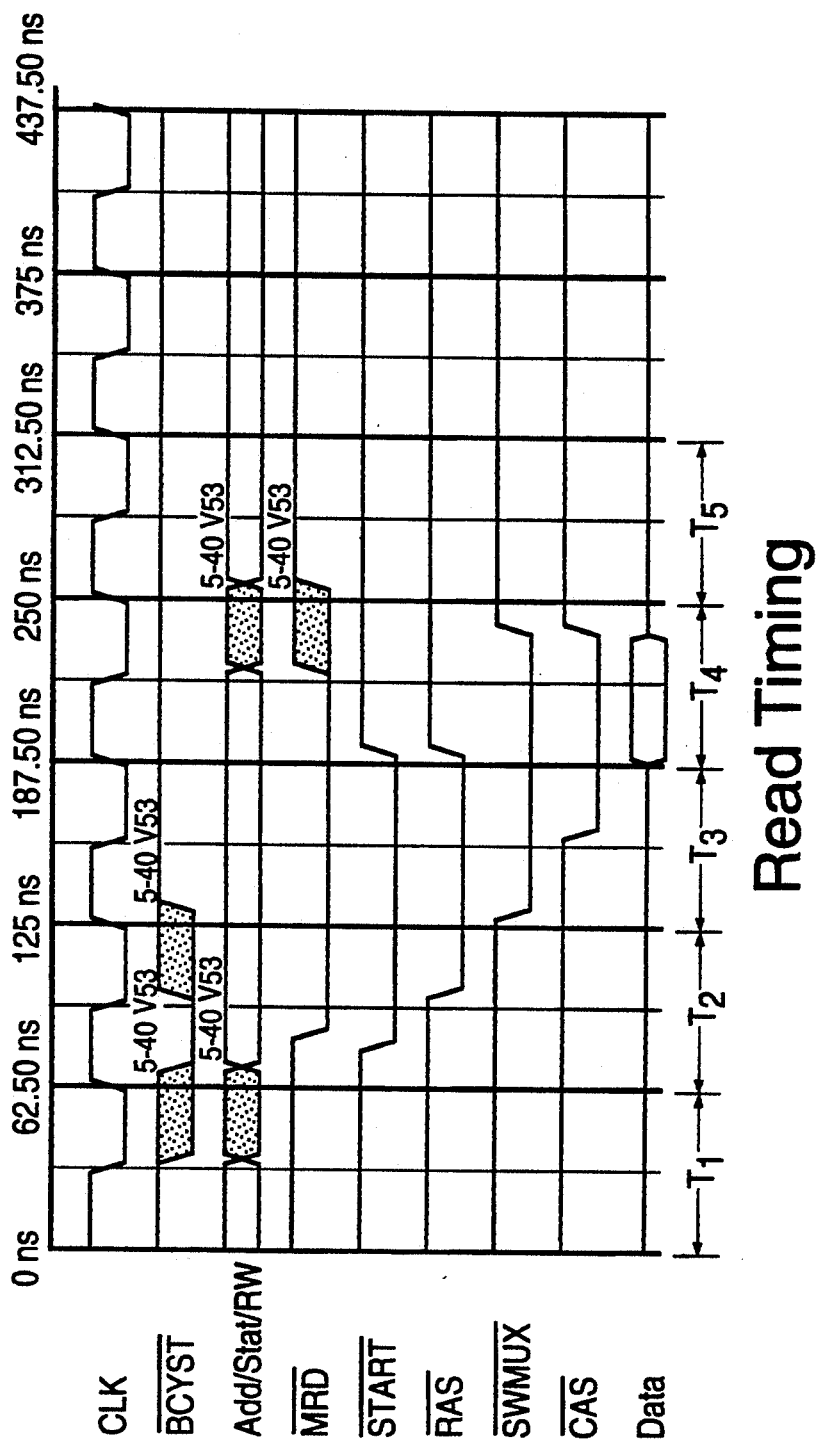
FIG. 3A Read Timing

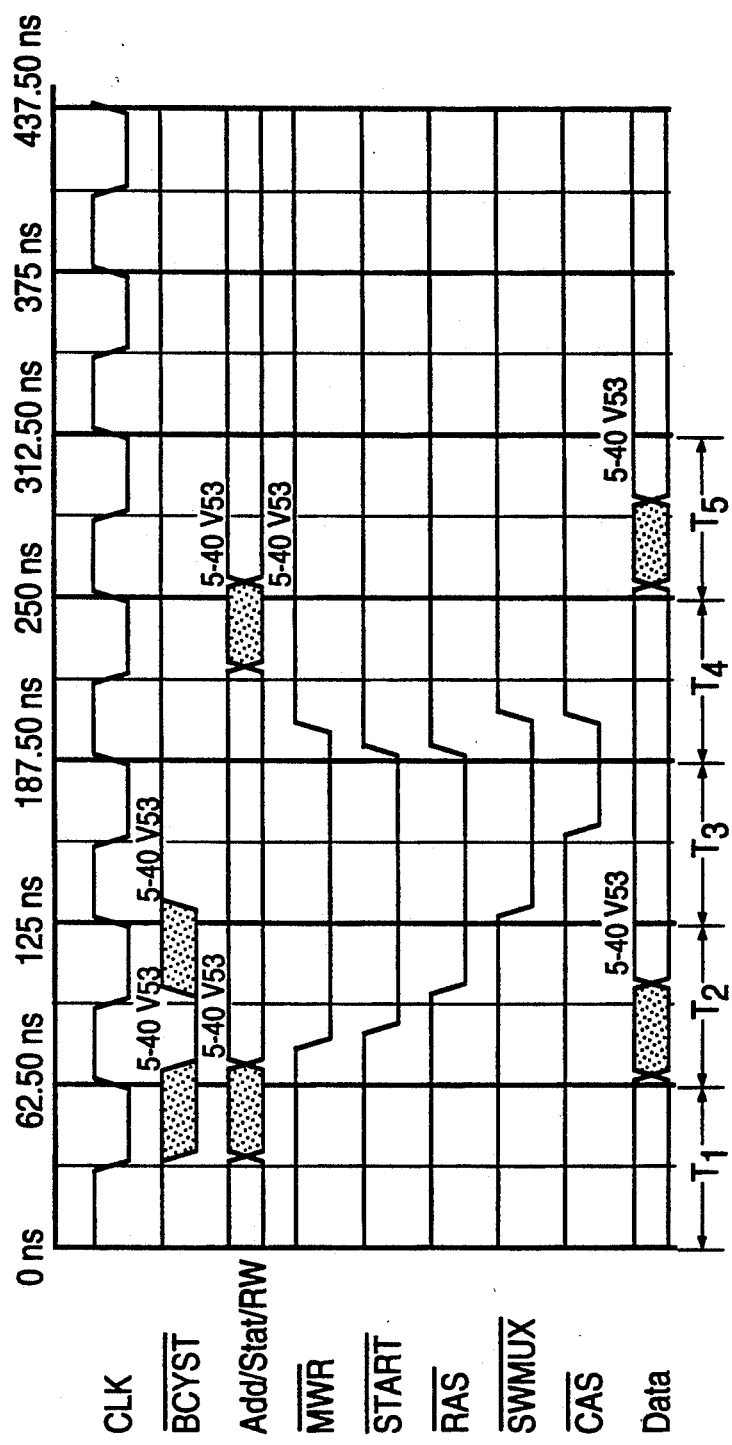
FIG. 3B  Write Timing

SINGLE-COMPONENT MEMORY CONTROLLER UTILIZING ASYNCHRONOUS STATE MACHINES

FIELD OF THE INVENTION

This invention relates to interface circuits for controlling dynamic random access memories (DRAMs) and other memory units using common microprocessor control signals and, in particular, such interface circuits which rely on clocked state machines.

BACKGROUND OF THE INVENTION

When a microprocessor and memory such as a DRAM operate together, they must be able to communicate with each other in order that data are properly written into and read from the memory. Normally, however, the microprocessor and the memory do not speak the same language. The microprocessor delivers a particular set of signals in conjunction with transferring data to or from storage, but the memory requires a different set of signals in order to play its complementary role in the data storage/retrieval process. In the case of a DRAM, the refresh cycle may also require communication with the microprocessor. Therefore, an interface or controller is required, to receive the signals from the microprocessor and convert them into signals that can be understood by the memory.

Interface circuits which use common microprocessor control signals to control a DRAM fall into essentially two categories: those which rely on delay lines, and those which rely on clocked state machines. In the delay line approach, a particular strobe signal is used to initiate an external delay line device. The delay line has a number of taps which provide rising or falling edge signals at preselected intervals. The problem with the older delay lines is that many are bulky and inaccurate. The newer, solid state delay lines are more accurate, but they are quite expensive. In general, many computer designers are reluctant to use delay line circuits.

In the clocked state machine approach, flip-flops are arranged to form state machines which generate the required timing. Since a particular flip-flop can be either rising-edge triggered or falling-edge triggered (but not both), two sets of flip-flops are required to trigger events on both edges of a single clock pulse. This prevents the design from being suitable for implementation on a PLD (programmable logic device).

Alternatively, a second "2X" clock is added to provide a clock pulse at twice the frequency of the internal microprocessor clock. This allows all rising-edge triggered flip-flops to be used, and permits the design to be implemented in a PLD. However, where no internal 2X clock is available, an external 2X clock must be provided. This adds to the expense of the interface. Moreover, in high speed systems (for example, those operating at 16 MHz) there is the problem of determining and minimizing the skew between a 32 MHz state machine clock and the 16 MHz microprocessor clock. If the skew is indeterminate or very long, it is difficult to keep the 2X clock and the microprocessor's clock tightly synchronized. A further problem arises from the fact that some microprocessors have a clock scaling function which saves power by allowing the central processor unit to slow down the clock during periods of inactivity. Most clock state machines are unable to anticipate such random changes in the timing of the CPU clock.

In accordance with this invention, a DRAM control circuit is provided which avoids the need for a 2X clock or two sets of flip-flops, one rising-edge triggered and the other falling-edge triggered.

SUMMARY OF THE INVENTION

A DRAM controller in accordance with this invention contains a plurality of flip-flops. A first flip-flop recognizes the conditions of a microprocessor's bus cycle start signal, a high condition of its clock pulse, and a valid DRAM address. These conditions cause the first flip-flop's output to go low.

A second flip-flop recognizes the low condition of the first flip-flop and the next low condition of the clock pulse. This causes the second flip-flop to go to its low condition, and the output of the second flip-flop is used as a row address strobe ($\overline{RAS}$) which is transmitted to the DRAM.

A third flip-flop recognizes the condition of the second flip-flop being low and the next clock pulse high. The satisfaction of this condition causes the output of the third flip-flop to go low. The output of the third flip-flop is used to switch one or more multiplexers from transmitting the row address to transmitting the column address to the DRAM.

A fourth flip-flop recognizes the condition of the third flip-flop being low and a high clock pulse. Upon the satisfaction of this condition, the fourth flip-flop goes low. The output of the fourth flip-flop is used as a column address strobe which enables the DRAM to receive a column address.

The condition for resetting the first and second flip-flops is the respective outputs of the third and fourth flip-flops being low and the clock pulse being high. In this manner the row address strobe, i.e., the output of the second flip-flop, is reset so as to allow a sufficient precharge time. The condition for resetting the third and fourth flip-flops is the deassertion of a memory read or memory write signal generated by the microprocessor. This assures that the column address strobe, i.e., the output of the fourth flip-flop, is reset so as to allow a sufficient precharge time.

Controllers of this invention may be used with a memory unit other than a DRAM and, depending on the particular memory, may require either more or fewer flip-flops than the embodiment described above. Such embodiments involve a series of flip-flops, with each successive flip-flop in the series responding to a state of a clock pulse (high or low) opposite to that of the next succeeding flip-flop in the series. In addition, an input of the second and succeeding flip-flops in the series is connected to the output of the next preceding flip-flop in the series.

A controller in accordance with this invention uses asynchronous set-reset flip-flops which are triggered on the level (high or low) instead of a rising or falling edge of the clock pulse. The controller can therefore be programmed onto a single PLD. It uses the microprocessor's clock pulse and requires no "2X" clock.

DESCRIPTION OF THE DRAWINGS

FIGS. 3A and 3B are timing diagrams of particular inputs and outputs of a DRAM controller in accordance with this invention during read and write cycles, respectively.

DESCRIPTION OF THE INVENTION

Figure 1A:
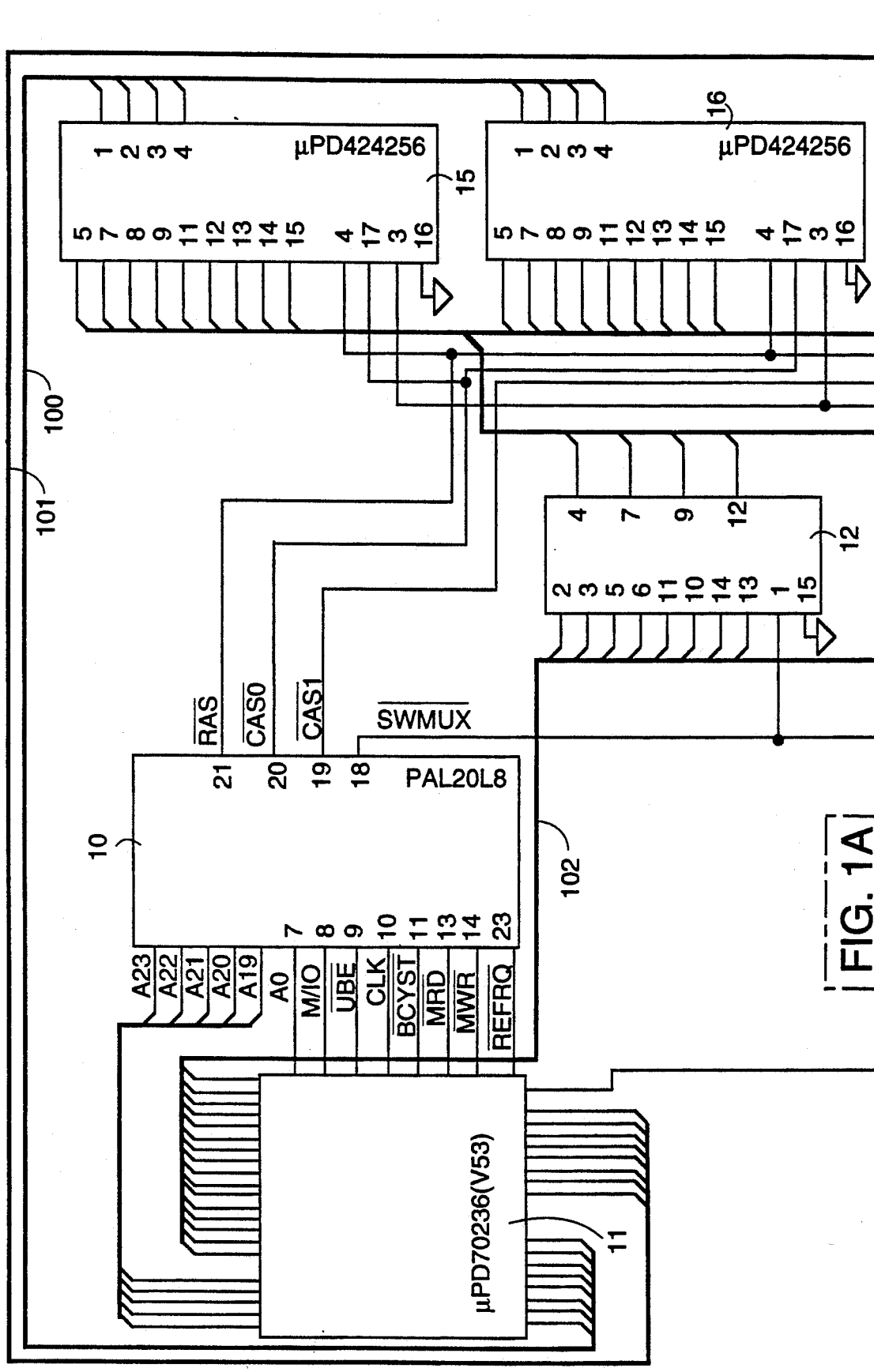
FIGS. 1A and 1B is a system diagram which shows a DRAM controller in accordance with this invention.

The following definitions apply herein:

"BCYST" refers to the Bus Cycle Start Strobe of microprocessor 11 shown in FIG. 1.

"CAS" refers to the Column Address Strobe produced by DRAM controller 10 shown in FIG. 1.

"$\overline{RAS}$" refers to the Row Address Strobe produced by DRAM controller 10.

"$\overline{SWMUX}$" refers to the Switch Multiplex signal produced by DRAM controller 10.

"CLK" refers to the clock pulse provided at the CLKOUT output (pin 46) of microprocessor 11.

"$\overline{REFRQ}$" refers to the Refresh Request signal provided at pin 10 of microprocessor 11.

"$\overline{MRD}$" refers to the Memory Read signal provided at pin 60 of microprocessor 11.

"$\overline{MWR}$" refers to the Memory Write signal provided at pin 59 of microprocessor 11.

"$A_0$–$A_{23}$" refer to the address bits generated at pins 91–94, 97–102, 104–107, 109–114, and 117–120, respectively, of microprocessor 11.

"$D_0$–$D_{15}$" refer to the data bits generated at pins 71, 72, 74–77, 79–84 and 87–90, respectively, of microprocessor 11.

"$\overline{UBE}$" refers to the Upper Byte Enable signal provided at pin 64 of microprocessor 11.

With regard to the status of an input or output of a logic gate or other state machine, a logical "1" or "high" refers to the higher state of the input or output and a logical "0" or "low" refers to the lower state of the input or output.

A horizontal line above the designation of a signal indicates that the signal is asserted low.

Figure 1B:
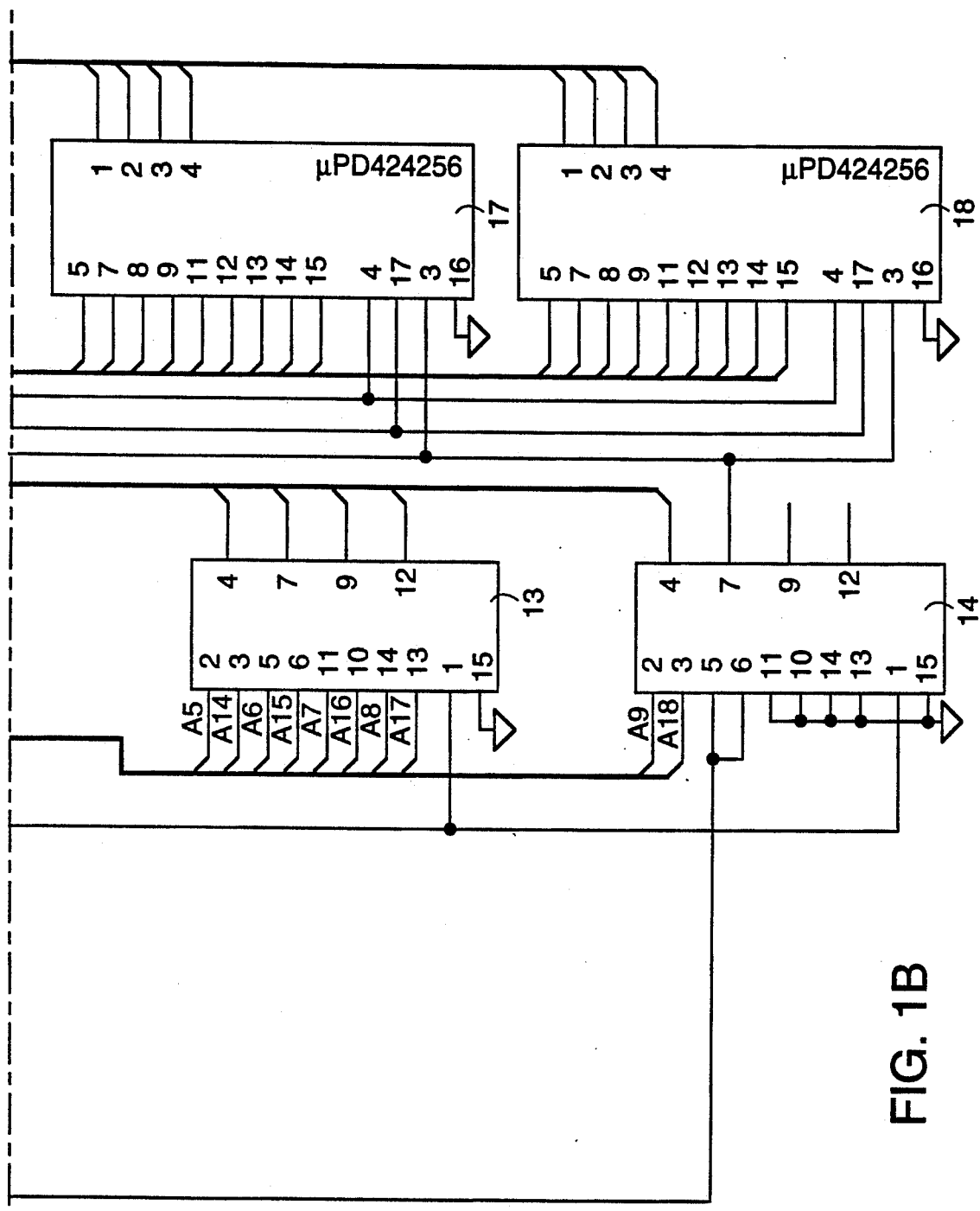

FIGS. 1A and 1B shows a DRAM controller 10 in accordance with this invention. Also shown are a microprocessor 11, multiplexers 12, 13 and 14, and DRAMs 15, 16, 17 and 18. In the embodiment of FIG. 1, DRAM controller 10 is a 20L8 PLD, appropriately programmed as described below. Microprocessor 11 is a µPD70236 16-bit microprocessor (also referred to as a V53 ™ ), manufactured by NEC Electronics Inc. Multiplexers 12–14 are 74AC157 multiplexers, manufactured by National Semiconductor, or an equivalent. DRAMs 15–18 are µPD424256 262,144×4-bit dynamic CMOS RAMs, manufactured by NEC Electronics Inc. Controller 10 and DRAMs 15–18 are described, respectively, in "µPD70236 (V53) 16-Bit Microprocessor: High-Speed, High-Integration, CMOS" (January 1990), referred to hereinafter as the "V53 Handbook," and "NEC Electronics Inc. Memory Products Data Book" (1989), pp. 5-95 to 5-109, both of which are available from NEC Electronics Inc., 401 Ellis Street, P.O. Box 7241, Mountain View, Calif. 94039, and are incorporated by reference herein.

The data I/O (input/output) pins of microprocessor 11 are connected via data buses 100 and 101 to the I/O pins of DRAMs 15–18. Data buses 100 and 101 each handle one byte (8 bits) of information. Data bus 100 is connected to pins 71, 72, 74–77, 79 and 80 of microprocessor 11, and to the four I/O pins of each of DRAMs 15 and 16. Data bus 101 is connected to pins 81–84 and 87–90 of microprocessor 11, and to the four I/O pins of each of DRAMs 17 and 18. Thus, data buses 100 and 101 together permit 16 bits of information to be exchanged between microprocessor 11 and DRAMs 15–18, with each of DRAMs 15–18 handling four bits of information.

An address bus 102 runs between microprocessor 11 and multiplexers 12–14. Each address in DRAMs 15–18 is represented by 18 bits of information, with nine bits for each row address and nine bits for each column address. The row address ($A_1$–$A_9$) appears at pins 92–94 and 97–102 of microprocessor 11. The column address ($A_{10}$–$A_{18}$) appears at pins 104–107 and 109–113 of microprocessor 11. Each of multiplexers 12–14 has two sets of 4-bit address inputs and a single 4-bit address output. In multiplexer 14, only two single-bit address inputs and a single-bit output are used. Accordingly, multiplexers 12 and 13 each have a 4-bit address output, and multiplexer 14 has a single-bit address output, so that the combined outputs of multiplexers 12–14 yield a 9-bit address.

The address outputs ($A_1$–$A_{18}$) of microprocessor 11 are connected to multiplexers 12–14 as follows. Pins 92–94 and 97 of microprocessor 11 ($A_1$–$A_4$) are connected to pins 2, 5, 11 and 14 of multiplexer 12; pins 98–101 of microprocessor 11 ($A_5$–$A_8$) are connected to pins 2, 5, 11 and 14 of multiplexer 13; and pin 102 of microprocessor 11 ($A_9$) is connected to pin 2 of multiplexer 14. Pins 104–107 of microprocessor 11 ($A_{10}$–$A_{13}$) are connected to pins 3, 6, 10 and 13 of multiplexer 12; pins 109–112 of microprocessor 11 ($A_{14}$–$A_{18}$) are connected to pins 3, 6, 10 and 13 of multiplexer 13; and pin 113 of microprocessor 11 ($A_{18}$) is connected to pin 3 of multiplexer 14. Accordingly, a 9-bit row address ($A_1$–$A_9$) is delivered to one set of inputs on multiplexers 12–14 and a 9-bit column address ($A_{10}$–$A_{18}$) is delivered to the other set of inputs on multiplexers 12–14.

The outputs of multiplexers 12–13 on pins 4, 7, 9 and 12 and the output of multiplexer 14 on pin 4 are connected to an address bus 103 which is tied in common to 9-bit address inputs on each of DRAMs 15–18 (pins 5, 7, 8, 9 and 11–15). Thus a 9-bit row or column address appearing at the outputs of multiplexers 12–14 is delivered simultaneously to the address inputs of each of DRAMs 15–18.

The remaining connections between microprocessor 11 and DRAM controller 10 are as follows:

Pins 114 and 117–120 ($A_{19}$–$A_{23}$) of microprocessor 11 are connected to pins 1–5 of controller 10. These five lines provide an address decode by which microprocessor 11 identifies DRAMs 15–18 as the intended recipients of the information it is transmitting.

Pins 91 ($A_0$) and 64 ($\overline{UBE}$) of microprocessor 11 are connected to pins 7 and 9, respectively, of controller 10. The $A_0$ and $\overline{UBE}$ outputs of microprocessor 11 indicate, when microprocessor 11 is accessing 8-bit data, whether the upper 8-bits ($D_8$–$D_{15}$) or the lower 8-bits ($D_0$–$D_7$) of its data outputs are being accessed. Table 1 describes the status of the $\overline{UBE}$ and $A_0$ pins:

TABLE 1

| Operation | $\overline{UBE}$ | $A_0$ |
|---|---|---|
| Upper 8 bits accessed | 0 | 1 |
| Lower 8 bits accessed | 1 | 0 |
| 16 bits accessed | 0 | 0 |

Pin 55 ($M/\overline{IO}$) of microprocessor 11 is connected to pin 8 of controller 10. The $M/\overline{IO}$ output indicates whether a memory or other device (such as an I/O device or a coprocessor) is currently accessed. In this embodiment, M/$\overline{IO}$ is in a high condition to indicate that a memory is accessed.

Pin 46 (CLKOUT) of microprocessor 11 is connected to pin 10 of controller 10. Pin 46 outputs a square-wave clock pulse, which is at the same frequency as the operating frequency of the CPU within microprocessor 11.

Pin 61 ($\overline{BCYST}$) of microprocessor 11 is connected to pin 11 of controller 10. The $\overline{BCYST}$ output of pin 61 indicates the start of a bus cycle by going low for one clock immediately after the bus cycle is started.

Pin 59 ($\overline{MWR}$) and pin 60 ($\overline{MRD}$) of microprocessor 11 are connected to pins 14 and 13, respectively, of controller 10. The $\overline{MWR}$ (memory write) output of pin 59 is asserted low when a memory write cycle is in progress, and the $\overline{MRD}$ (memory read) output of pin 60 is asserted low during a read cycle. The output from pin 59 ($\overline{MWR}$) of microprocessor 11 is also buffered through pins 5 and 6 of multiplexer 14 to the write enable ($\overline{WE}$) inputs on pin 3 of DRAMs 15–18.

Pin 10 ($\overline{REFRQ}$) of microprocessor 11 is connected to pin 23 of controller 10. The $\overline{REFRQ}$ (refresh request) signal on pin 10 is asserted low during refresh cycles.

Each of DRAMs 15–18 essentially requires three control signals in connection with its read/write operations: a row address strobe ($\overline{RAS}$) which is asserted low while the row address is valid; and a column address strobe ($\overline{CAS}$) which is asserted low while the column address is valid; and a write enable ($\overline{WE}$) which is asserted low during a write cycle and is not asserted during a read cycle. These signals are common to many types of DRAMs other than the μPD424256.

DRAM controller 10 has outputs on pins 18–21, respectively. The output of pin 21 delivers a $\overline{RAS}$ signal to pin 4 of DRAMs 15–18. Pin 20 of controller 10 provides a $\overline{CAS}$ signal to pin 17 of DRAMs 15 and 16. Pin 19 of controller 10 delivers a $\overline{CAS}$ signal to pin 17 of DRAMs 17 and 18. Pin 18 of controller 10 delivers a switch multiplexer ($\overline{SWMUX}$) signal to pin 1 of each of multiplexers 12–14. As noted above, the $\overline{WE}$ signal is delivered directly to pin 3 of each of DRAMs 15–18 from pin 59 ($\overline{MWR}$) of microprocessor 11, after buffering through multiplexer 14.

Controller 10 also has outputs on pin 15 (RAS_P) and pin 17 ($\overline{START}$) which are connected internally, as described below.

Appendix 1 shows PLD equations for controller 10 in "ABEL" assembler, which is available on the market ("ABEL" is a registered trademark of DATA IO Corporation). FIGS. 2A–2E show, in the form of functional logic diagrams, the results of programming controller 10 (20L8) in accordance with the equations shown in Appendix 1.

FIGS. 3A and 3B are timing diagrams for the read and write cycles, respectively, of the embodiment of FIG. 1. Referring to FIGS. 3A and 3B, the first four waveforms, labelled CLK, $\overline{BCYST}$, Add/Stat/RW and $\overline{MRD}$ (in the case of FIG. 3A) or $\overline{MWR}$ (in the case of FIG. 3B), refer to the corresponding outputs of microprocessor 11 described above The waveform labelled $\overline{START}$ refers to the output on pin 17 of controller 10. The next four waveforms, labelled $\overline{RAS}$, $\overline{SWMUX}$, $\overline{CAS0}$ and $\overline{CAS1}$, refer to the outputs of controller 10 which are delivered to DRAMs 15–18 (in the case of $\overline{RAS}$, $\overline{CAS0}$ and $\overline{CAS1}$) and multiplexers 12–14 (in the case of $\overline{SWMUX}$). The final waveform, labelled DATA, indicates when valid data appear on data buses 100 and 101. With regard to FIG. 3A, valid data refers to data output from DRAMs 15–18 for reading by microprocessor 11. With regard to FIG. 3B, valid data refers to data output from microprocessor 11 for writing into DRAMs 15–18. The five clock pulses shown in FIGS. 3A and 3B are designated $T_1$ through $T_5$, each of which has a duration of 62.50 ns (16 MHz).

At a clock rate of 16 MHz and set at 0-wait states, microprocessor 11 has a system access time (address valid to data valid in a read cycle) of 78 ns. The cost of a DRAM meeting this condition may be excessive. Set at 1-wait state, the system access time is 140 ns, which allows for a DRAM having a substantially less expensive design. Accordingly, microprocessor 11 has been set at 1-wait state. The method of doing this is described at page 61 of the V53 Handbook.

The key wave forms for the DRAMs 15–18 are $\overline{RAS}$ (row address strobe), which must be asserted low at the correct time while the row address is present at the address inputs of DRAMs 15–18; and $\overline{CAS}$ (column address strobe), which must be asserted low at the correct time while the column address is present at the address inputs of DRAMs 15–18. In addition, $\overline{SWMUX}$ must be asserted low at the correct time to switch outputs of multiplexers 12–14 from the row address to the column address. FIGS. 3A and 3B show the times at which these wave forms must be asserted, assuming that $\overline{BCYST}$ (Bus Cycle Start Strobe) is asserted during the time frame shown in FIGS. 3A and 3B.

The operation of controller 10 will be described by reference to FIGS. 2A–2E, which are functional logic diagrams representing the logic structure of controller 10 (20L8) after it has been programmed in accordance with Appendix 1.

Figure 2A:
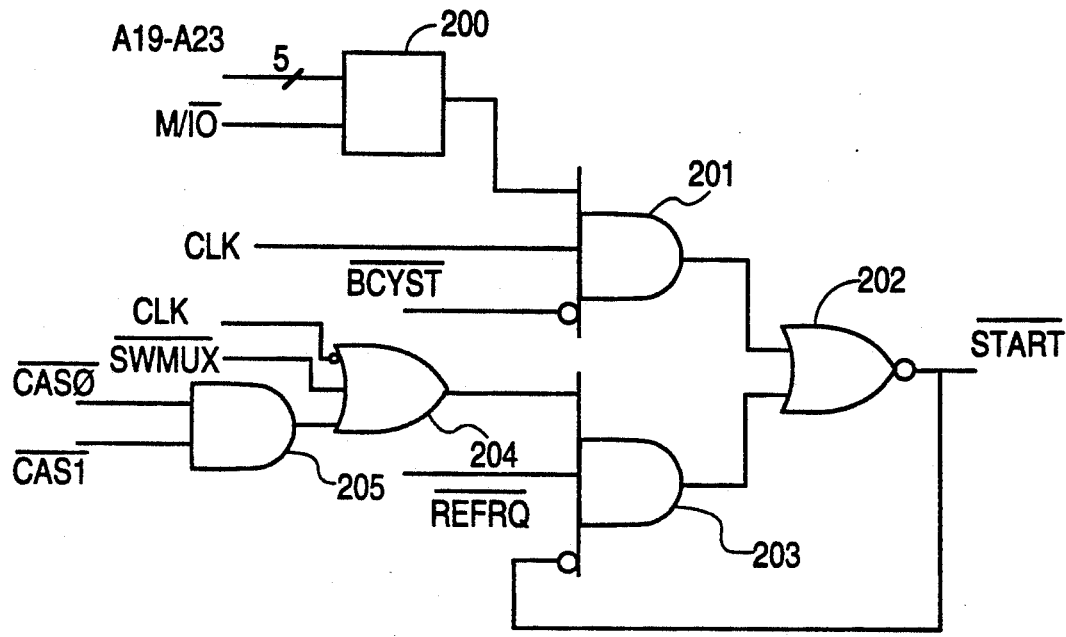
FIGS. 2A-2E are functional logic diagrams of a DRAM controller in accordance with this invention.

Referring to FIG. 2A, address lines $A_{19}$–$A_{23}$ are fed to one input of an address decoder 200, the other input of which is connected to the M/$\overline{IO}$ line. When DRAMs 15–18 are being addressed by microprocessor 11, the correct code will appear on lines $A_{19}$–$A_{23}$ and the M/$\overline{IO}$ line will be a logical 1, representing a memory access. The output of address decoder 200 is delivered along with CLK to the inputs of an AND gate 201. The third input of AND gate 201 is connected to an inverted $\overline{BCYST}$. Assuming that the output of address decoder 200 is a 1, indicating that DRAMs 15–18 are being addressed, AND gate 201 delivers a 1 output when CLK is a 1 and $\overline{BCYST}$ is a 0. As shown in FIGS. 3A and 3B, this occurs at the beginning of $T_2$. The output of AND gate 201 thus delivers a 1 to an input of a NOR gate 202. As will become apparent, the other input of NOR gate 202 is at a 0. Thus the output of NOR gate 202 goes from a 1 to a 0. This is the $\overline{START}$ wave form shown in FIGS. 3A and 3B which, as indicated, is asserted low when $\overline{BCYST}$ is low and CLK is high.

The $\overline{START}$ output of NOR gate 202 is inverted and fed back to an input of an AND gate 203. A second input of AND gate 203 is derived from the output of an OR gate 204. The inputs of OR gate 204 are, respectively, an inverted CLK, $\overline{SWMUX}$, and the output of an AND gate 205 which has as inputs $\overline{CAS0}$ and $\overline{CAS1}$. As explained below, $\overline{CAS0}$ and $\overline{CAS1}$ are e,ovs/CAS/ signals directed to DRAMs 15–16 and DRAMs 17–18, respectively. A third input to AND gate 203 carries the $\overline{REFRQ}$ signal. Since $\overline{CAS0}$ and $\overline{CAS1}$ are both in their unasserted state, which is a 1, the output of AND gate 205 is a 1. Similarly, $\overline{SWMUX}$ is in its unasserted 1 state. Thus the output of OR gate 204 is a 1, as is the $\overline{REFRQ}$ signal. When the output of NOR gate 202 goes to a 0 (i.e., when $\overline{START}$ is asserted), the three inputs to AND gate 203 are a 1 and the output of AND gate 203 leading to an input of NOR gate 202 likewise becomes a 1. This latches $\overline{START}$ in its asserted state regardless of what happens at the output of AND gate 201.

In summary, the logic circuitry shown in FIG. 2A results in $\overline{START}$ being asserted when $\overline{BCYST}$ is asserted low and CLK goes high and a valid DRAM address is present in the first half of $T_2$ (FIG. 3A), and it is latched in this state until an appropriate change occurs at the inputs of AND gate 203. This is described below.

Figure 2B:
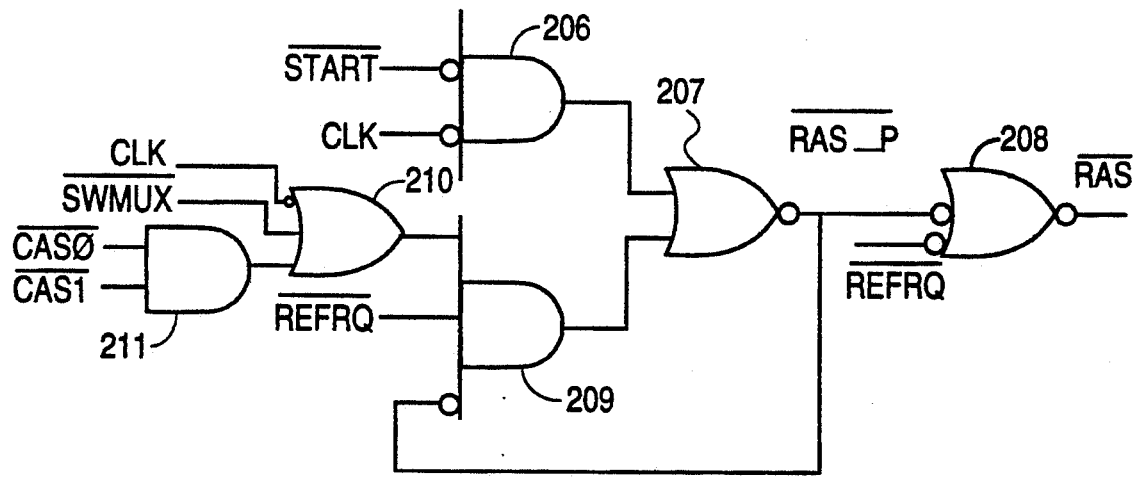

Referring to FIG. 2B, the $\overline{START}$ signal provided by NOR gate 202 (FIG. 2A) is inverted and directed to an input of an AND gate 206, the other input of which is an inverted CLK. Thus the output of AND gate 206 is a 0 so long as $\overline{START}$ is a 0 and CLK is a 1, during the first half of $T_2$. At the mid-point of $T_2$, however, CLK becomes a 0, and the output of AND gate 206 becomes a 1. This signal is directed to an input of a NOR gate 207, the output of which is referred to as the RAS_P signal. When the output of AND gate 206 becomes a 1, RAS_P becomes a 0, RAS_P is inverted and directed to an input of a NOR gate 208, the output of which is $\overline{RAS}$. Accordingly, when RAS_P becomes a 0, $\overline{RAS}$ also becomes a 0.

The RAS_P output of NOR gate 207 is inverted and fed back to an input of an AND gate 209. AND gate 209 is associated with an OR gate 210 and an AND gate 211. The inputs to and connections between AND gate 209, OR gate 210, and AND gate 211 are identical to the inputs to and connections between AND gate 203, OR gate 204 and AND gate 205 in FIG. 2A. The $\overline{REFRQ}$ signal provides a third input to AND gate 209. For the same reasons described above, the input to AND gate 209 from OR gate 210 and the $\overline{REFRQ}$ signal are in a 1 state. Thus, when RAS_P becomes a 0, the output of AND gate 209 becomes a 1 and latches the output of NOR gate 207 in a 0. Thus, when RAS_P and $\overline{RAS}$ are both latched in an asserted, low condition.

Accordingly, the logic circuitry shown in FIG. 2B results in $\overline{RAS}$ being asserted low with the fall of CLK in the middle of $T_2$ (FIG. 3A) and it is latched in this state until an appropriate change occurs at the inputs of AND gate 209.

Figure 2C:
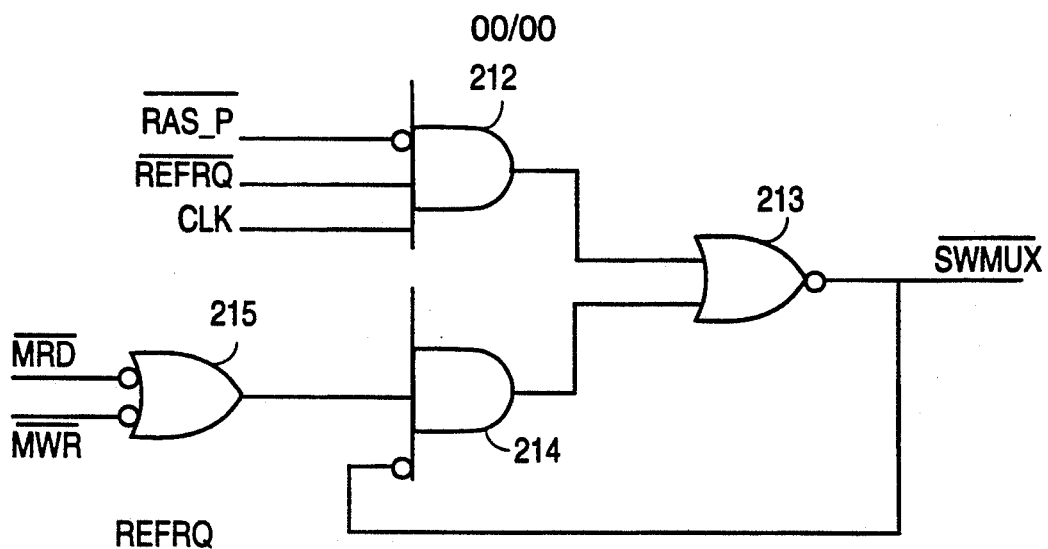

Referring to FIG. 2C, the RAS_P output of NOR gate 207 (FIG. 2B) is inverted and directed to an input of an AND gate 212. The other two inputs of AND gate 212 are lines carrying the $\overline{REFRQ}$ and CLK signals, respectively. . When RAS_P is asserted low, as described above, the corresponding input to AND gate 212 becomes a 1. The $\overline{REFRQ}$ signal is a 1 except during a refresh cycle. Accordingly when CLK again goes to a 1 (at the beginning of $T_3$), the output of AND gate 212 becomes a 1. The output of AND gate 212 is connected to an input of a NOR gate 213. Thus the output of NOR gate 213 becomes a 0. This is the $\overline{SWMUX}$ signal. The $\overline{SWMUX}$ output of NOR gate 213 is inverted and fed back to an input of an AND gate 214, the other input of which is connected to an output of an OR gate 215. The two inputs of OR gate 215 are an inverted $\overline{MRD}$ (Memory Read) signal and an inverted $\overline{MWR}$ (Memory Write) signal from microprocessor 11. As shown in FIG. 3A, during a read cycle the $\overline{MRD}$ signal goes to a 0 condition during the first half of $T_2$. Thus the output of OR gate 215 is a 1, and when $\overline{SWMUX}$ goes to a 0, the output of AND gate 214 becomes 1. The output of AND gate 214 is connected to an input of NOR gate 213, and therefore the $\overline{SWMUX}$ output of NOR gate 213 is latched in a 0 condition.

Thus, the logic circuitry shown in FIG. 2C results in the $\overline{SWMUX}$ signal being asserted low with the rise of CLK at the beginning of $T_3$ (FIG. 3A), and it is latched in this state until an appropriate change occurs at the input of AND gate 214.

Figure 2D:
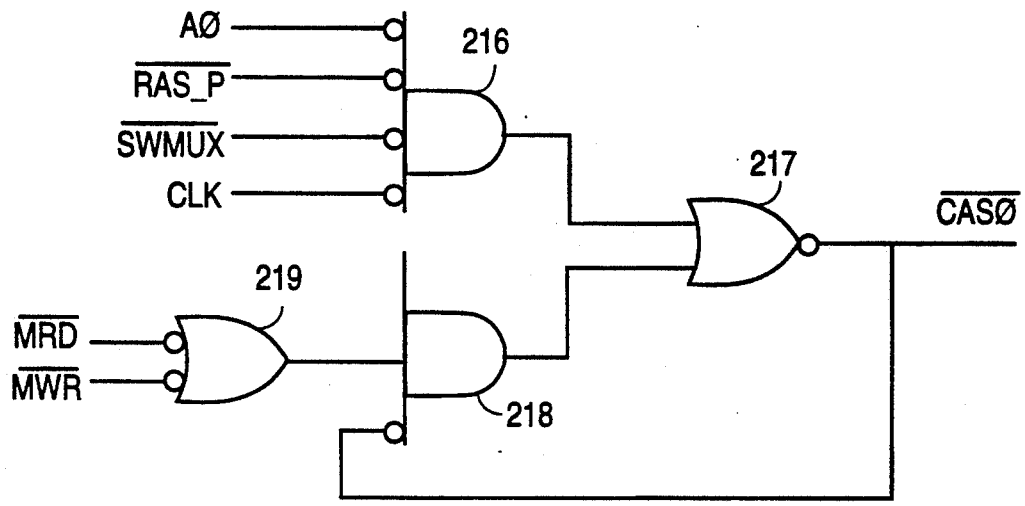
Figure 2E:
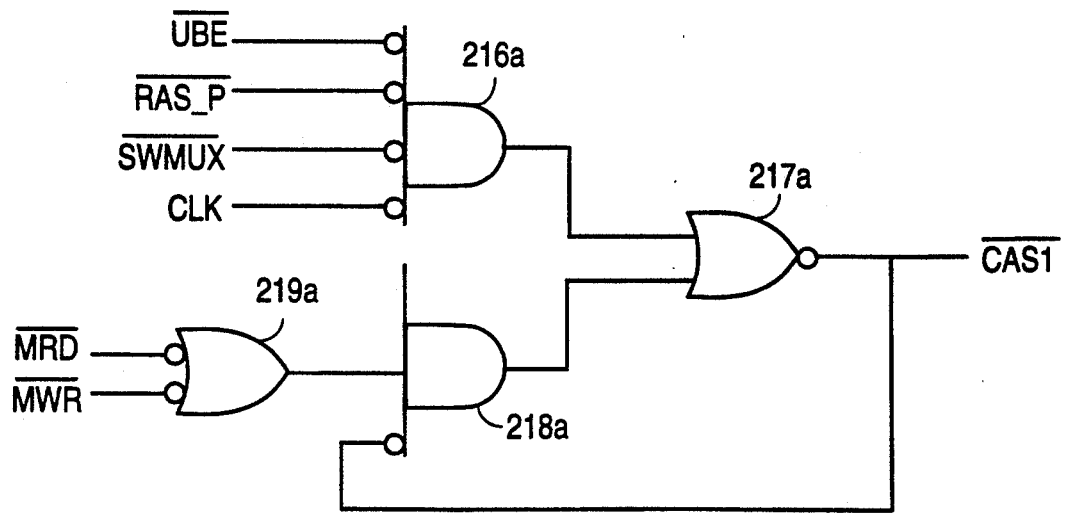

FIGS. 2D and 2E show the logic circuitry required to generate the CAS0 and CAS1 signals, respectively. It will be recalled that CAS0 is the column address strobe which is delivered to DRAMs 15 and 16, and CAS1 is the column address strobe which is delivered to DRAMs 17 and 18. The logic circuitry shown in FIGS. 2D and 2E is identical except for the use of $A_0$ and $\overline{UBE}$ signals to determine whether the lower 8 data bits (DRAMs 15 and 16), the upper 8 data bits (DRAMs 17 and 18), or all 16 data bits (DRAMs 15-18) will be accessed.

The circuits of FIGS. 2D and 2E contain respective AND gates 216 and 216a, each of which has four inputs. Three of the inputs of AND gates 216 and 216a are connected to inverted RAS_P, $\overline{SWMUX}$ and CLK, respectively. In FIG. 2D, the fourth input of AND gate 216 is connected to an inverted $A_0$ signal. In FIG. 2E, the fourth input of AND gate 216a is connected to an inverted $\overline{UBE}$ signal.

Following the assertion of $\overline{SWMUX}$, as described in connection with FIG. 2C, both RAS_P and $\overline{SWMUX}$ are 0's and CLK is a 1. Thus, when CLK next falls to a 0, the output of respective AND gates 216 and 216a in FIG. 2D and 2E will depend on the status of the $A_0$ and $\overline{UBE}$ signals, respectively. As shown in Table 1, microprocessor 11 may be operated with an 8-bit or 16-bit data bus. In the 8-bit mode, $A_0$ is a 0 and $\overline{UBE}$ is a 1 when only the lower 8 bits are accessed. As shown in FIG. 2D, if $A_0$ is a 0, the falling CLK in the middle of $T_3$ will cause the output of AND gate 216 to switch to a 1. The output of AND gate 216 is connected to an input of a NOR gate 217. The output of NOR gate 217 will therefore switch to a 0 and CAS0 will be asserted, enabling the column address to be received by DRAMs 15 and 16. With $\overline{UBE}$ in a 1 condition, however, there will be no output from AND gate 216a in FIG. 2E, and no CAS1 signal will be transmitted to DRAMs 17 and 18. As a result, 8 data bits ($D_0$-$D_7$) are read from DRAMS 15 and 16 (4 bits each).

Table 1 indicates that $\overline{UBE}$ is a 0 and $A_0$ is a 1 if only the upper 8 bits are accessed. With $\overline{UBE}$ a 0, the output of AND gate 216a in FIG. 2E will switch to a 1 when CLK becomes a 0 in the middle of $T_3$. Thus, a CAS1 signal will be produced at the output of NOR gate 217a, enabling the column address to be received by DRAMs 17 and 18. With the $A_0$ signal a 1 condition, however, there will be no output from AND gate 216 in FIG. 2E and no CAS0 signal will be transmitted to DRAMs 15 and 16. As a result, 8 data bits are read from DRAMs 17 and 18 (4 bits each).

Table 1 indicates that both $A_0$ and $\overline{UBE}$ are a 0 if microprocessor 11 is accessing 16-bit data. In this situation, the outputs of both AND gate 216 and AND gate 216a will switch to a 1 with the falling CLK signal in the middle of $T_3$, and both a CAS0 signal and a CAS1 signal will be produced, enabling DRAMs 15-18 to receive a column address. As a result, 16 data bits are read from DRAMs 15-18 (4 bits each).

Assuming that $\overline{RAS}$, CAS0 and CAS1 have all been asserted, it is important that they be reset so as to allow an adequate precharge time before the next read or write cycle begins. Referring to FIG. 2A, after $\overline{SWMUX}$ and either CAS0 or CAS1 have switched to a 0, the output of OR gate 204 will switch to a 0 the next time CLK moves to a 1. These conditions occur at the beginning of T4. At this time the output of OR gate 204 becomes a 0 and the output of AND gate 203 likewise becomes a 0. Since $\overline{BCYST}$ has become a 1, the output of AND gate 201 becomes a 0 and the $\overline{START}$ output of NOR gate 202 becomes a 1. This represents the resetting of $\overline{START}$.

Referring to FIG. 2B, when $\overline{START}$ goes to a 1, the output of AND gate 206 becomes a 0. Since the respective inputs of OR gate 210 and AND gate 211 are identical to those of OR gate 204 and AND gate 205, for the reasons described above, the output of OR gate 210 will switch to a 0 when the CLK signal goes to a 1 at the beginning of T4. Thus the output of AND gate 209 will become a 0 and the outputs of NOR gates 207 and 208 will become a 1. Thus, RAS_P and $\overline{RAS}$ are reset at 1 simultaneously with the resetting of $\overline{START}$. This is shown in FIG. 3A.

Referring to FIG. 2C, when RAS_P switches to a 1, the output of AND gate 212 will become a 0. When $\overline{MRD}$ becomes a 1, the output of OR gate 215 will become a 0 and the output of AND gate 214 will likewise become a 0. Thus the $\overline{SWMUX}$ output of NOR gate 213 is reset simultaneously with $\overline{MRD}$.

As shown in FIGS. 2D and 2E, the resetting of $\overline{MRD}$ also triggers the resetting of either or both CAS0 and CAS1. With RAS_P and $\overline{SWMUX}$ both being a 1, the outputs of AND gates 216 and 216a are switched to a 0. When $\overline{MRD}$ switches to a 1, the outputs of OR gates 219 and 219a become a 0 and the outputs of AND gates 218 and 218a become a 0. The outputs of NOR gates 217 (CAS0) and 217a (CAS1) therefore become a 1.

This completes the read cycle. It will be noted that the waveforms generated by microprocessor 11 shown in FIG. 3A are manipulated by controller 10 in such a way that the signals required by multiplexers 12-14 and DRAMs 15-18 are generated.

During a write cycle (see FIG. 3B), the assertion of $\overline{START}$, $\overline{RAS}$, $\overline{SWMUX}$, CAS0 and CAS1 are generated in almost exactly the same manner as in the read cycle. The only difference is that at the inputs of OR gate 215 (FIG. 2C), OR gate 219 (FIG. 2D) and OR gate 219a (FIG. 2E) the $\overline{MWR}$ signal will be asserted low instead of the $\overline{MRD}$ signal, thus assuming a 1 output at each of these OR gates. As shown in FIGS. 3A and 3B, $\overline{MRD}$ and $\overline{MWR}$ are asserted at the same time during a read cycle and a write cycle, respectively. While $\overline{MWR}$ is reset before $\overline{MRD}$, this occurs later than and does not affect the assertion of $\overline{RAS}$, $\overline{SWMUX}$, CAS0 and CAS1. Likewise, the resetting of $\overline{START}$ and $\overline{RAS}$ occurs in exactly the same way as during the read cycles. Both of these events occur at the beginning of T4, before $\overline{MWR}$ is reset. With regard to FIG. 2C, after RAS_P has been reset, the output of AND gate 212 is switched to a 0. When $\overline{MWR}$ is reset, the output of OR gate 215 becomes a 0, as does the output of AND gate 214. Thus, $\overline{SWMUX}$ is reset simultaneously with the resetting of $\overline{MWR}$, which occurs slightly earlier than the resetting of $\overline{MRD}$ the read cycle. This, however, creates no problem since the column address has already been read by DRAMs 15-18 when this occurs.

Referring to FIGS. 2D and 2E, RAS_P and $\overline{SWMUX}$ have been reset, and the outputs of AND gates 216 and 216a have therefore been switched to a 0. When $\overline{MWR}$ is reset, the outputs of OR gates 219 and 219a become a 0, and the outputs of AND gates 218 and 218a likewise become a 0. Thus CAS0 and CAS1 (whether either or both have been asserted) are reset simultaneously with the resetting of $\overline{MWR}$.

This completes the write cycle. The waveforms generated by microprocessor 11 shown in FIG. 3B are manipulated in such a way that the signals required by multiplexers 12-14 and DRAMs 15-18 are generated.

All 512 rows of each of DRAMs 15-18 ($\mu$PD424256) must be refreshed at least once every 8 msec. This can be accomplished in two ways. The assertion of $\overline{CAS}$ before $\overline{RAS}$ enables an address counter inside the device. This internal address counter permits the refresh cycle to take place without an external refresh address. Alternatively, the DRAM may be strobed with $\overline{RAS}$ and an external refresh address may be provided. In this embodiment, refresh is performed using the latter method.

Microprocessor 11 contains a refresh control register which (assuming a 16 MHz clock) can be programmed to a range of refresh intervals from 1 to 32 $\mu$s, and to operate with either 8- or 16-bit memory devices. The refresh control register is accessed at I/O address FFF2H, and is described in detail at page 62 of the V53 Handbook. Each refresh cycle requires a minimum of four clock pulses. A number of wait states from 0 to 7 can be programmed into the WCY4 register (I/O address FFF6H). This is also described at page 62 of the V53 Handbook.

Referring to FIG. 2B, an inverted $\overline{REFRQ}$ is provided as an input to NOR gate 208. When $\overline{REFRQ}$ is asserted low, $\overline{RAS}$ is asserted low at the output of NOR gate 208. Thus, during a refresh cycle, $\overline{REFRQ}$ triggers $\overline{RAS}$ to assure that appropriate row addresses generated by microprocessor 11 are delivered to DRAMs 15-18. $\overline{REFRQ}$ also appears at inputs to AND gate 203, AND gate 209 and AND gate 212, in effect preventing a 1 output from those AND gates while $\overline{REFRQ}$ is asserted low. This prevents any unwanted $\overline{START}$, RAS_P or $\overline{SWMUX}$ signals from being asserted during a refresh cycle.

While the embodiment described above is a DRAM controller, the controller of this invention may be used to control other types of memory units such as static random access memories (SRAMs) as well as various types of input/output (I/O) devices. All of the foregoing are subsumed under the term "memory" or "memory unit" as used herein. Controllers for different types of memory units may require either greater or fewer flip-flops than the embodiment described above.

The foregoing description is of a single embodiment in accordance with the invention. Numerous other and alternative embodiments within the broad scope of this invention will be apparent to those skilled in the art. ,200

I claim:

1. A random access memory (RAM) controller for transmitting a first set of control signals to a memory unit in response to a second set of control signals from a microprocessor, said controller comprising:
   a first flip-flop, said first flip-flop being activated in response to a control signal from said microprocessor indicating a start of a bus cycle and a first state of a clock signal form said microprocessor;
   a second flip-flop, said second flip-flop being activated in response to an active condition of said first flip-flop and a second state of said clock signal;
   a third flip-flop, said third flip-flop being activated in response to an active condition of said second flip-flop and said first state of said clock signal; and a fourth flip-flop, said fourth flip-flop being activated in response to an active condition of said third flip-flop and said second state of said clock signal;

wherein said clock signal alternates between said first and second states in a cyclical fashion;

the outputs of said second, third, and fourth flip-flops are included in said first set of control signals to said memory unit;

each of said first, second, third and fourth flip-flops comprises a NOR gate having a first input and a second input, said first input and said second input being connected to the outputs of a first AND gate and a second AND gate, respectively; and in each of said flip-flops said clock signal is connected to an input of said first AND gate, and the output of said NOR gate is connected to an input of said second AND gate.

2. The memory controller of claim 1 wherein:

said signal indicating the start of a bus cycle is connected to an input of the first AND gate of said first flip-flop; and the output of the NOR gate in said first, second and third flip-flops is connected to an input of the first AND gate in said second, third and fourth flip-flops, respectively.

3. The memory controller of claim 2 wherein an input of said second AND gate in each of said first and second flip-flops is connected to an output of a circuit comprising a NOR gate having a first input connected to said clock signal, a second input connected to the output of the NOR gate of said third flip-flop, and a third input connected to the output of the NOR gate of said fourth flip-flop.

4. The memory controller of claim 3 comprising a NOR gate, a first input of which is connected to the output of the NOR gate of said second flip-flop and a second input of which is for receiving a signal from said microprocessor indicating that a refresh cycle is requested.

5. The memory controller of claim 2 comprising a fifth flip-flop substantially similar to said fourth flip-flop, wherein:

the output of said fifth flip-flop is also included in said first set of control signals to said memory unit;

an input of said first AND gate of said fourth flip-flop is connected to a control signal from said microprocessor indicating that a first portion of said memory unit is being accessed; and an input of said first AND gate of said fifth flip-flop is connected to a control signal from said microprocessor indicating that a second portion of said memory unit is being accessed.

6. The memory controller of claim 5 wherein said memory unit is a dynamic random access memory (DRAM).

7. A combination comprising:

a microprocessor;

a memory unit, said memory unit having a first input for receiving a first address strobe signal and a second input for receiving a second address strobe signal; and a controller for said memory unit comprising a series of flip-flops, an input of the first flip-flop in said series being connected to an output of said microprocessor for indicating a start of a bus cycle, an input of the second and following flip-flops in said series being connected to an output of the next preceding flip-flop in said series, wherein:

the first and every other odd-numbered flip-flop in said series is responsive to a first state of a clock signal from said microprocessor and the second and every other even-numbered flip-flop in said series is responsive to a second state of said clock signal, said clock signal alternating between said first and second states in a cyclical fashion; and said second flip-flop in said series comprises a first address strobe output connected to said first input of said memory unit and a fourth flip-flop in said series comprises a second address strobe output connected to said second input of said memory unit.

8. The combination of claim 7 further comprising a multiplexer and wherein said controller further comprises a switch multiplexer output for delivering a switch multiplex signal to said multiplexer.

9. The combination of claim 8 wherein said series comprises five flip-flops, a second flip-flop being for delivering a row address strobe signal, a fourth flip-flop being for delivering a first column address strobe signal, and a fifth flip-flop being for delivering a second column address strobe signal.

10. The combination of claim 9 wherein a third flip-flop is for delivering said switch multiplex signal.

11. A combination comprising:

a microprocessor;

a memory unit; and a random access memory (RAM) controller for transmitting a first set of control signals to a memory unit in response to a second set of control signals form a microprocessor, said controller comprising:

a first flip-flop, said first flip-flop being activated in response to a control signal from said microprocessor indicating a start of a bus cycle and a first state of a clock signal from said microprocessor;

a second flip-flop, said second flip-flop being activated in response to an active condition of said first flip-flop and a second state of said clock signal;

a third flip-flop, said third flip-flop being activated in response to an active condition of said second flip-flop and a said first state of said clock signal; and a fourth flip-flop, said fourth flip-flop being activated in response to an active condition of said third flip-flop and said second state of said clock signal;

wherein said clock signal alternates between said first and second states in a cyclical fashion; and said first set of control signals includes a row address strobe signal and a column address strobe signal, said strobe signals serving to indicate that an address is currently present at the address inputs of said memory unit.

12. The memory controller of claim 11 wherein each of said first, second, third and fourth flip-flops comprises a NOR gate having a first input and a second input, said first input and said second input being connected to the outputs of a first AND gate and a second AND gate, respectively, the output of said NOR gate in each of said flip-flops being connected to an input of said second AND gate in the same flip-flop, the output of said NOR gate in each of said first, second and third flip-flops being connected to an input of the first AND gate in said second, third and fourth flip-flops, respectively.

13. The combination of claim 11 wherein said second flip-flop is for delivering said row address strobe signal and said fourth flip-flop is for delivering said column address strobe signal.

14. The combination of claim 13 wherein said column address strobe signal is delivered as an input to said first flip-flop.

15. The combination of claim 11 further comprising a fifth flip-flop and a multiplexer, said fifth flip-flop being connected to an output of said third flip-flop and delivering a second column address strobe signal, said third flip-flop delivering a switch multiplex signal.

16. The combination of claim 15 wherein said column address strobe signal and said second column address strobe signal are delivered as inputs to said first flip-flop.

* * * * *